United States Patent
Flaibani et al.

(10) Patent No.: US 12,355,340 B2
(45) Date of Patent: Jul. 8, 2025

(54) COMPARISON SIGNAL GENERATOR FOR POWER CONVERTER

(71) Applicant: Infineon Technologies AG, Neubiberg (DE)

(72) Inventors: Marco Flaibani, Montegrotto Terme (IT); Stefano Zampieri, Padua (IT); Giovanni Bisson, Padua (IT)

(73) Assignee: Infineon Technologies AG, Neubiberg (DE)

( * ) Notice: Subject to any disclaimer, the term of this patent is extended or adjusted under 35 U.S.C. 154(b) by 258 days.

(21) Appl. No.: 18/308,151

(22) Filed: Apr. 27, 2023

(65) Prior Publication Data

US 2024/0364207 A1    Oct. 31, 2024

(51) Int. Cl.
*H02M 3/158* (2006.01)
*H02M 1/08* (2006.01)
*H02M 3/157* (2006.01)
*H03K 5/24* (2006.01)

(52) U.S. Cl.
CPC ............. *H02M 1/08* (2013.01); *H02M 3/157* (2013.01); *H02M 3/158* (2013.01); *H03K 5/24* (2013.01)

(58) Field of Classification Search
CPC .... H02M 3/156; H02M 3/158; H02M 3/1588; H02M 3/155; H02M 3/1582; H02M 3/157; H02M 3/1563; H02M 3/1584; H02M 1/32; H02M 1/081–084; H02M 1/0006; H04B 2215/069
See application file for complete search history.

(56) References Cited

U.S. PATENT DOCUMENTS

2020/0389087 A1*  12/2020  Hiasa .................. H02M 1/36

FOREIGN PATENT DOCUMENTS

CN          113141109 A  *  7/2021  .............. H02M 1/08

OTHER PUBLICATIONS

CN_113141109 Translation (Year: 2021).*

* cited by examiner

*Primary Examiner* — Bryan R Perez
(74) *Attorney, Agent, or Firm* — Shumaker & Sieffert, P.A.

(57) ABSTRACT

A circuit includes a switching signal generator and synchronization circuitry configured to determine a first time of a switching period based on a switching signal. The circuit further includes a comparison signal generator configured to generate a comparison signal with a first constant rate of change after the first time. The synchronization circuitry is further configured to determine a second time of the switching period based on when current at the inductive element changes from a positive current to a negative current. The comparison signal generator is further configured to generate the comparison signal with a second constant rate of change after the second time. The circuit further includes a threshold detector configured to compare a value of the comparison signal at the end of a target switching period with a threshold value.

20 Claims, 9 Drawing Sheets

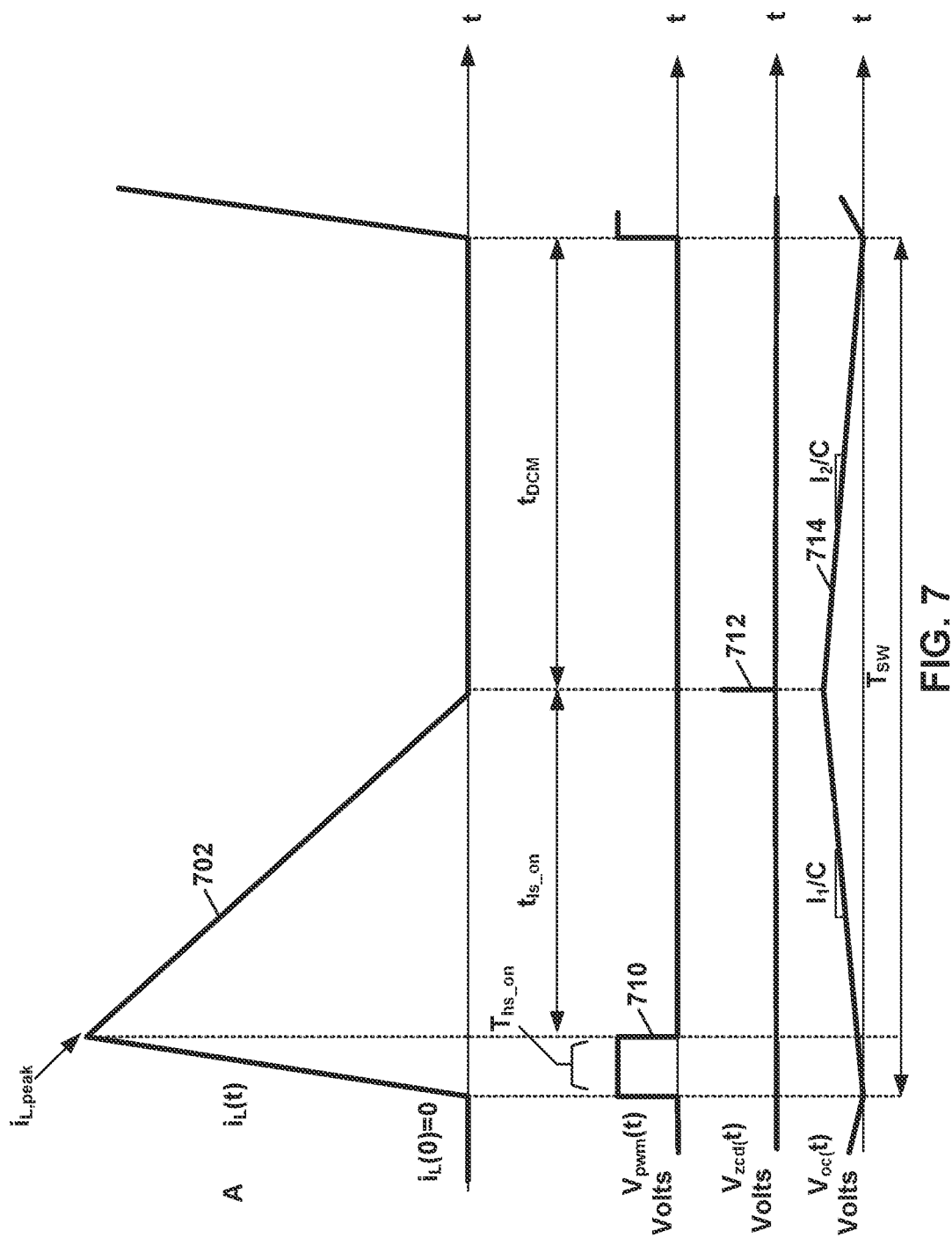

COMPARISON SIGNAL GENERATOR FOR POWER CONVERTER

TECHNICAL FIELD

This disclosure relates to circuits and techniques for operating a power converter.

BACKGROUND

A circuit may generate a switching signal to control an operation of a power converter. The circuit may control a voltage, current, and/or power output by the power converter using a duty cycle of the switching signal. For example, the circuit may generate the switching signal with a duty cycle to regulate a voltage output by a Buck converter.

SUMMARY

In general, this disclosure is directed to techniques for determining whether to operate a power converter in a discontinuous conduction mode (DCM) or a continuous conduction mode (CCM). For example, a circuit may directly determine to operate the power converter in DCM or CCM. In some examples, the circuit may output a comparison value indicating whether an average inductor current exceeds a threshold value and another circuit determines whether to operate the power converter in DCM or CCM. When the power converter is operating in the CCM, a circuit may control a duty cycle for a fixed switching cycle based on an average of the current at an inductive element of the power converter during the fixed switching period. In contrast, when the power converter is operating in the DCM, the circuit may control a duration of a switching period.

In accordance with the techniques of the disclosure, a circuit may generate a comparison signal based on the switching signal and when current at the inductive element changes from a positive current to a negative current. In this way, the comparison signal may be synchronized with a current at the inductive element without relying on direct measurements of the current at the inductive element, which may help to reduce a power consumption of the circuit. The circuit may generate a switching signal using a measured peak inductor current. In some examples, however, the circuit may estimate the peak inductor current, which may help to reduce a power consumption of the control circuit compared to systems that use a measured peak inductor current.

In one example, this disclosure describes a circuit comprising a switching signal generator configured to control, using a switching signal, a switching element to provide current to charge an inductive element of a power converter and synchronization circuitry configured to determine a first time of a switching period based on the switching signal. The circuit further includes a comparison signal generator configured to generate a comparison signal with a first constant rate of change after the first time. The synchronization circuitry is further configured to determine a second time of the switching period based on when current at the inductive element changes from a positive current to a negative current. The comparison signal generator is further configured to generate the comparison signal with a second constant rate of change after the second time. The circuit further includes a threshold detector configured to compare a value of the comparison signal at the end of a target switching period with a threshold value. The target switching period is initiated at the first time.

In another example, this disclosure describes a method including controlling, using a switching signal, a switching element to provide current to charge an inductive element of a power converter and determining a first time of a switching period based on the switching signal. The method further includes generating a signal with a first constant rate of change after the first time and determining a second time of the switching period based on when current at the inductive element changes from a positive current to a negative current. The method further includes generating the comparison signal with a second constant rate of change after the second time and comparing a value of the comparison signal at the end of a target switching period with a threshold value, wherein the target switching period is initiated at the first time.

In another example, this disclosure describes a system including a power converter comprising an inductive element and a control circuit. The control circuit comprising a switching signal generator configured to control, using a switching signal, a switching element to provide current to charge the inductive element of the power converter and synchronization circuitry configured to determine a first time of a switching period based on the switching signal. The control circuit further comprising a comparison signal generator configured to generate a signal with a first constant rate of change after the first time. The synchronization circuitry is further configured to determine a second time of the switching period based on when current at the inductive element changes from a positive current to a negative current. The comparison signal generator is further configured to generate the signal with a second constant rate of change after the second time. The control circuit further comprising a threshold detector configured to compare a value of the signal at the end of a target switching period with a threshold value, wherein the target switching period is initiated at the first time.

Details of these and other examples are set forth in the accompanying drawings and the description below. Other features, objects, and advantages will be apparent from the description and drawings, and from the claims.

BRIEF DESCRIPTION OF DRAWINGS

FIG. 7 is a graph illustrating an example of a comparison signal, in accordance with one or more techniques of this disclosure.

DETAILED DESCRIPTION

In general, this disclosure is directed to techniques for defining a threshold on an average load current of a power converter (e.g., a Buck DCDC converter) working in DCM (Discontinuous Conduction Mode) where a low current consumption is desirable. The average load current may be defined as being equal to the average inductance current $I_{L,avg}$.

Some systems may directly measure all timing information, such as, for example, a high-side turn on time of a switching signal ($t_{hs,on}$), a low-side turn on time of the switching signal ($t_{ls,on}$), and a switching period of the switching signal ($T_{SW}$) plus the peak inductor current to reconstruct a current shape and/or to calculate an average inductor current value. To generate the timing information, such systems may use a high frequency clock running (e.g., not less than 100 MHz) and a current sensing circuit that can increase the quiescent current of the system, which may increase power consumption of the system.

In accordance with the techniques of the disclosure, instead of directly measuring all related parameters to evaluate an average load current, a system may derive the average load current indirectly by sensing voltages and/or currents that are already present or sensed in a power converter implementation, such as, for example, an input voltage of the power converter (Vin), an output voltage of the power converter (Vout), a zero crossing of a current at an inductive element of the power converter (zcd), a start of a switching signal (pwm_ctrl), and/or a high-side current (hs current sense).

For example, rather than relying on a high frequency clock for measurements of a current at an inductor of the power converter for timing, a system may generate a comparison signal based on the switching signal and when current at the inductive element changes from a positive current to a negative current. In this way, the comparison signal may be synchronized with a current at the inductive element without relying on direct measurements of the current at the inductive element, which may help to reduce a power consumption of the system. The system may generate a switching signal using a measured peak inductor current. In some examples, however, the system may estimate the peak inductor current, which may help to reduce a power consumption of the system compared to systems that use a measured peak inductor current.

Figure 1:
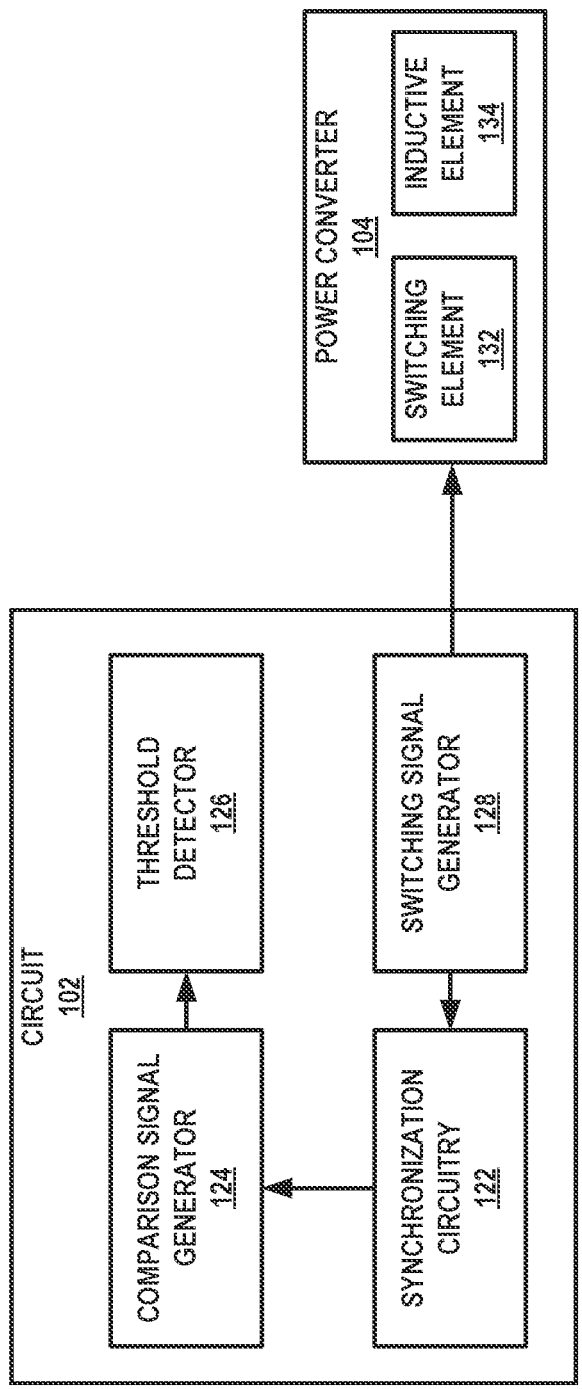
FIG. 1 is a block diagram illustrating an example system for determining whether to operate a power converter in a discontinuous conduction mode (DCM) or a continuous conduction mode (CCM), in accordance with this disclosure.

FIG. 1 is a block diagram illustrating an example system 100 for determining whether to operate a power converter 104 in a discontinuous conduction mode (DCM) or a continuous conduction mode (CCM), in accordance with one or more techniques of this disclosure. As illustrated in the example of FIG. 1, system 100 may include a circuit 102 and power converter 104. Circuit 102 may include synchronization circuitry 122, comparison signal generator 124, threshold detector 126, and switching signal generator 128.

Figure 2:
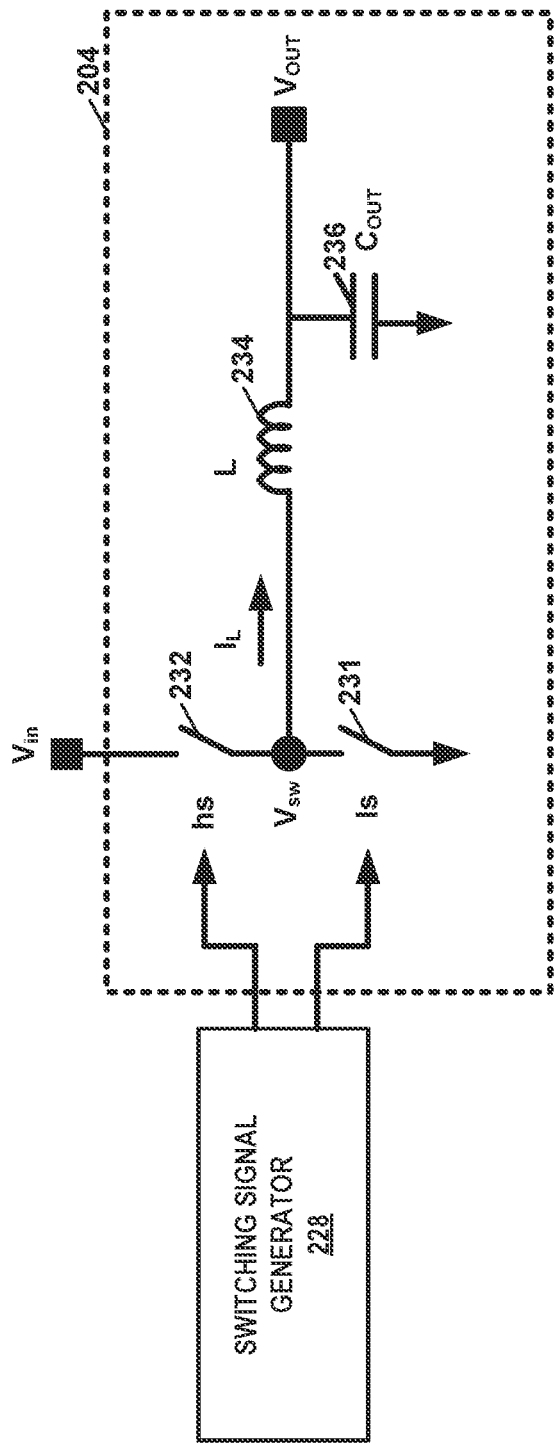
FIG. 2 is a conceptual diagram illustrating an example of a power converter, in accordance with this disclosure.

Power converter 104 may include a switching element 132 and an inductive element 134. For instance, power converter 104 may include a Buck converter as shown in FIG. 2. Inductive element 134 may be formed using one or more inductors connected in series or parallel. For example, inductive element 134 may include one or more discrete inductors and/or one or more distributed inductors formed as metallization layers on an integrated circuit.

Switching element 132 may include, but is not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. Examples of BJTs may include, but are not limited to, PNP, NPN, heterojunction, or any other type of BJT, or any combination of the same. In some examples, two or more of an SCR, a FET, or a BJT may be interconnected to form switching element 132. Switching elements may be configured to high-side or low-side switching elements. Additionally, switching elements may be voltage-controlled and/or current-controlled. Examples of current-controlled switching elements may include, but are not limited to, gallium nitride (GaN) MOSFETs, BJTs, or other current-controlled elements.

Circuit 102 may be configured to control switching element 132 using a switching signal. For example, circuit 102 may include a driver configured to directly drive switching element 132. In some examples, however, circuit 102 may output a switching signal to a driver circuit (e.g., implemented within an integrated circuit implementing circuit 102 or in circuitry outside of circuit 102). In this example, the driver circuit may drive switching element 132 based on the switching signal output by circuit 102. Circuit 102 may include an analog circuit. For instance, analog circuitry of circuit 102 may perform the functions described in one or more of synchronization circuitry 122, comparison signal generator 124, threshold detector 126, or switching signal generator 128.

Circuit 102 may include a microcontroller on a single integrated circuit containing a processor core, memory, inputs, and outputs. For example, circuit 102 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may refer to any of the foregoing logic circuitry, alone or in combination with other logic circuitry, or any other equivalent circuitry. For instance, digital circuitry of circuit 102 may perform the functions described in one or more of synchronization circuitry 122, comparison signal generator 124, threshold detector 126, or switching signal generator 128. In some examples, circuit 102 may be a combination of one or more analog components and one or more digital components. For instance, a combination of both digital circuitry and analog circuitry of circuit 102 may perform the functions described in one or more of synchronization circuitry 122, comparison signal generator 124, threshold detector 126, or switching signal generator 128.

In accordance with the techniques of the disclosure, switching signal generator 128 may control, using a switching signal, switching element 132 to provide current to charge inductive element 134. For example, switching signal generator 128 may generate the switching signal as a pulse-width modulated (PWM) signal that includes a duty cycle and a switching period. Switching signal generator 128 may output the switching signal to synchronization circuitry 122.

Synchronization circuitry 122 may determine a first time of a switching period based on the switching signal. For example, synchronization circuitry 122 may determine, using the switching signal output by switching signal generator 128, the first time to correspond to (e.g., match) to a time when switching element 132 (e.g., a high-side switch) is switched-in. Synchronization circuitry 122 may output the first time to comparison signal generator 124.

Comparison signal generator 124 may generate a comparison signal with a first constant rate of change after the first time. For example, comparison signal generator 124 may add a first value to a current value of the comparison signal to generate a subsequent value of the comparison signal. In some examples, comparison signal generator 124 may drive a first current to charge the capacitor (See FIG. 6). Comparison signal generator 124 may output the comparison signal to threshold detector 126.

Synchronization circuitry 122 may determine a second time of the switching period based on when current at inductive element 134 changes from a positive current to a negative current. For example, synchronization circuitry 122 may determine the second time to correspond to (e.g., match) to a time when the current at inductive element 134 crosses zero. For instance, synchronization circuitry 122 may determine the second time to correspond to (e.g., match) to a time when a zero current crossing detector detects a zero current condition has occurred at inductive element 134. Synchronization circuitry 122 may output the second time to comparison signal generator 124.

Comparison signal generator 124 may generate the comparison signal with a first constant rate of change after the second time. For example, comparison signal generator 124 may subtract a second value to the current value of the comparison signal to generate the subsequent value of the comparison signal. In some examples, comparison signal generator 124 may drive a second current to discharge the capacitor (See FIG. 6).

Threshold detector 126 may compare a value of the comparison signal at the end of a target switching period with a threshold value. In some examples, the target switching period is initiated at the first time (e.g., when switching element 132 is switched-in). Threshold detector 126 may determine whether to operate power converter 104 in DCM or CCM based on the comparison of the value at the end of the target switching period with the threshold value (e.g., zero or a predefined non-zero value). For example, threshold detector 126 may determine to operate the power converter in the CCM when the value of the comparison signal at the end of the target switching period is not greater than the threshold value. The threshold value may be a predefined value set to, for example, zero. Threshold detector 126 may determine to operate the power converter in the DCM when the value of the comparison signal at the end of the target switching period is greater than the threshold value. In some examples, however, threshold detector 126 may output the comparison result and other circuitry (e.g., within circuit 102 or external to circuit 102) may determine whether to operate power converter 104 in DMC or CCM. In this way, circuit 102 may or other circuitry of system 100 may determine whether to control power converter 104 in DCM or CCM, which may help to reduce a power consumption of the system 100 compared to systems that rely on direct measurements of the current at inductive element 134.

FIG. 2 is a conceptual diagram illustrating an example of a power converter 204, in accordance with this disclosure. As shown, power converter 204 includes high-side switching element 232, low-side switching element 233, inductive element 234, and capacitive element 236. Switching signal generator 228 may be an example of switching signal generator 128 of FIG. 1.

Switching signal generator 128 may generate the switching signal to operate power converter 104 a three-state mode for DCM. The three-state mode may include a high side switching state, a low side switching state, and an open switching state. In the high side switching state, high-side switching element 232 is open and low-side switching element 231 is closed. In the low side switching state, high-side switching element 232 is open and low-side switching element 231 is closed. In the open switching state, both high-side switching element 232 and low-side switching element 231 are closed.

Switching signal generator 228 may generate the switching signal (hs) to operate power converter 204 in CCM that includes, for example, the high side switching state and the low side switching state. Switching signal generator 228 may generate, when operating power converter 104 in the CCM and/or DCM, the switching signal (hs and/or ls) to include a deadtime between states where both high-side switching element 232 and a low-side switching element 231 are open.

Figure 3:
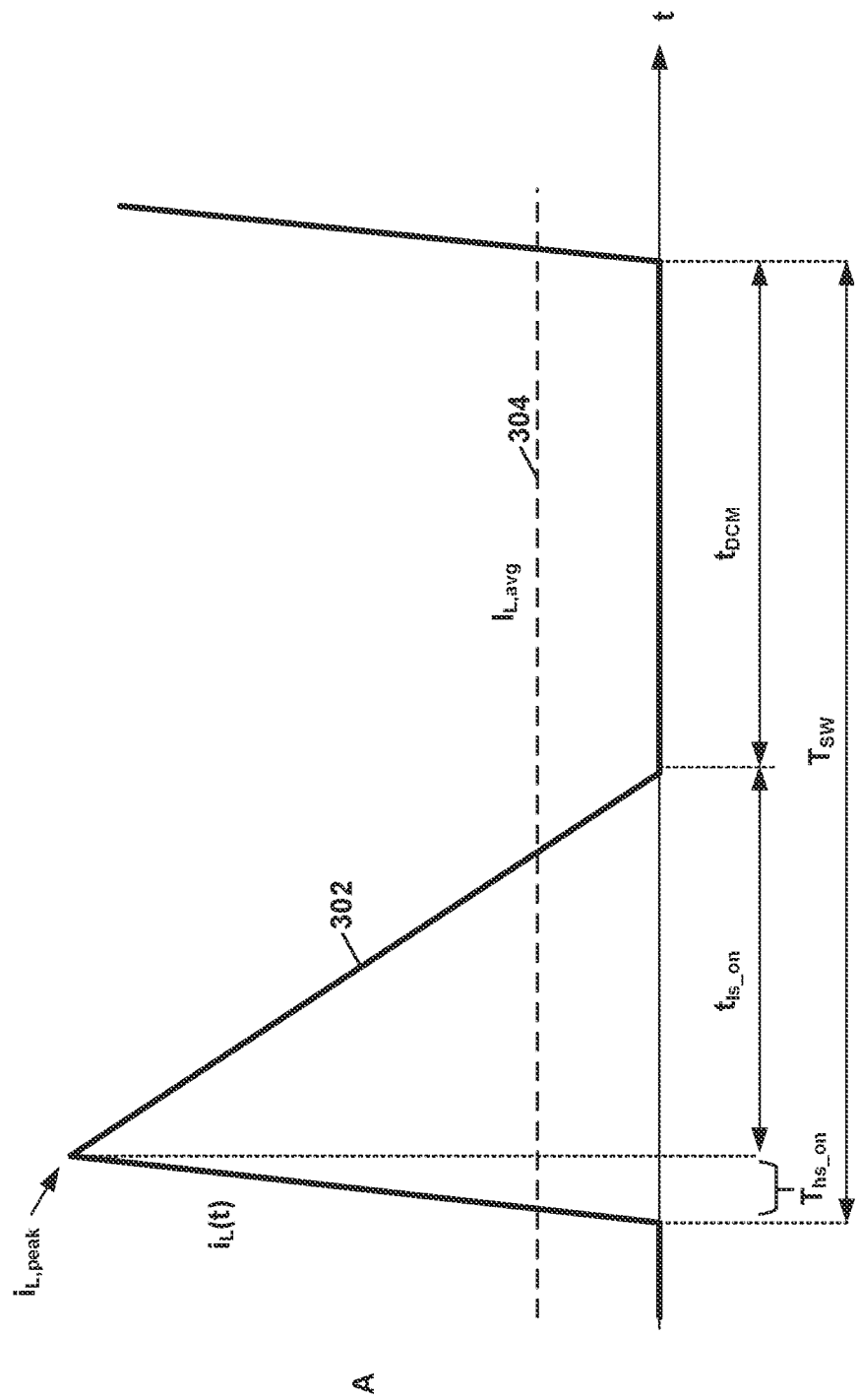
FIG. 3 is a graph illustrating example current at an inductive element when operating a power converter in DCM, in accordance with this disclosure.

FIG. 3 is a graph illustrating example current 302 at an inductive element when operating a power converter in DCM, in accordance with one or more techniques of this disclosure. The horizontal axis (x-axis) represents time (t) and the vertical axis (y-axis) represents current 302 at an inductive element ($i_L(t)$) in amps (A). FIG. 3 is discussed with reference to FIGS. 1-2 for example purposes only.

The average of a periodic signal (with period $T_{SW}$) is as follows:

$$x_{avg} = \frac{1}{T_{SW}} \int_0^{T_{SW}} x(t)dt \qquad \text{EQUATION 1}$$

where $x_{avg}$ is the average of the periodic signal (x(t)), $T_{SW}$ is the period of the periodic signal, and x (t) is the periodic signal.

In the example of FIG. 3, system 100 may calculate the average current 304 through the inductance using EQUATION 2.

$$I_{L,avg} = \frac{i_{L,peak}}{2} \cdot \frac{t_{hs,on} + t_{ls,on}}{T_{SW}} \qquad \text{EQUATION 2}$$

where $i_{L,avg}$ is the average current at inductive element 234, $t_{hs,on}$ is a turn on time of high-side switching element 232, $t_{ls,on}$ is a turn on time of low-side switching element 231, and $T_{SW}$ is the switching period of the switching signal. Said differently, the switching period ($T_{SW}$) may include the time $t_{hs,on}$ for the high side switching state, the time $t_{ls,on}$ for the low side switching state, and the time $t_{DCM}$ for the open switching state.

Referring to FIG. 3, if $$t_{hs,on} + t_{ls,on} \triangleq \frac{1}{K} T_{SW}, \text{ then } I_{L,avg} = \frac{i_{L,peak}}{2K}.$$

As such, a threshold average current $I_{L,avg}$ can be defined by setting $K \geq 1$ and knowing $i_{L,peak}$.

$$K = \frac{T_{SW}}{t_{hs,on} + t_{ls,on}} = \frac{t_{hs,on} + t_{ls,on} + t_{DCM}}{t_{hs,on} + t_{ls,on}} = 1 + \frac{t_{DCM}}{t_{hs,on} + t_{ls,on}} = \frac{i_{L,peak}}{2 \cdot I_{L,avg}} \quad \text{EQUATION 3}$$

System 100, or more specifically, for example, switching signal generator 128, may calculate the value $i_{L,peak}$ using EQUATION 4.

$$i_{L,peak} = i_L(t_{hs,on}) = \frac{1}{L} \int_0^{t_{hs,on}} v_L(t)dt + i_L(0) = \frac{(V_{in} - V_{out}) \cdot t_{hs,on}}{L} + i_L(0) \quad \text{EQUATION 4}$$

System 100, or more specifically, for example, switching signal generator 128, may obtain the peak current at inductor 234 directly (e.g., using a current sense technique) or indirectly. For example, system 100 may indirectly obtain the peak current at inductive element 234 by indirect estimation sensing $V_{in}$ and $V_{out}$, which may be simpler than sensing current when $V_{in}$ and $V_{out}$ are steady voltages and using the nominal value of inductance (L) of inductive element 234 and initial current at inductive element 234 $i_L(0)$ to calculate $t_{hs,on}$. The nominal value of inductance (L) of inductive element 234 may be a fixed value with a variation (e.g., ±20%). System 100 may estimate the initial current at inductive element 234 $i_L(0)$ as zero ($i_L(0)=0$) when operating power converter 204 in DCM.

As such, system 100 may estimate the peak current at inductive element 234 based on only the difference ($V_{in}-V_{out}$) as shown in EQUATION 5.

$$i_{L,peak} = \frac{(V_{in} - V_{out}) \cdot t_{hs,on}}{L} \quad \text{EQUATION 5}$$

Figure 4:
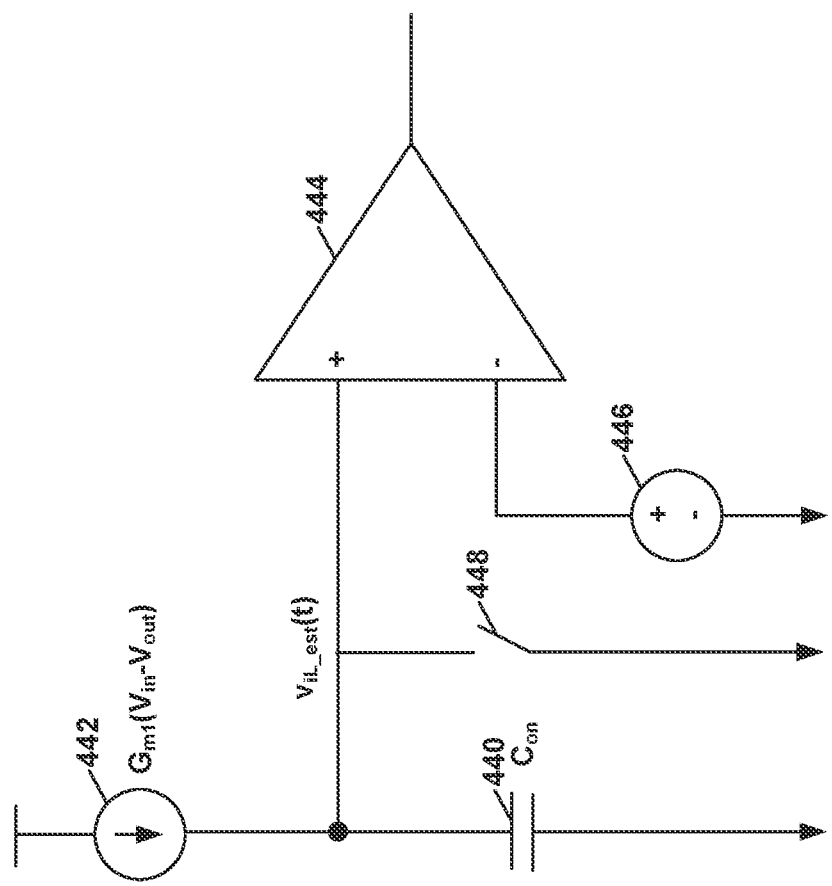
FIG. 4 is a circuit diagram illustrating an example circuit for estimating a peak of the current at the inductive element when operating a power converter in DCM, in accordance with this disclosure.

FIG. 4 is a circuit diagram illustrating an example of estimating a peak of the current at inductive element 134 when operating power converter 104 in DCM, in accordance with one or more techniques of this disclosure. FIG. 4 is discussed with reference to FIGS. 1-3 for example purposes only.

In the example of FIG. 4, system 100 (e.g., circuit 102 or, more specifically, for example, switching signal generator 128) may include a capacitor 440, a current source 442, a comparator 444, reference voltage 446 (e.g., a reference voltage supply), and a switching element 448. Switching element 448 may discharge capacitor 440 such that a voltage at capacitor 440 ($V_{iL\_est}(t)$) at that start of each period equals zero. Current source 442 may be configured to output a charging current to capacitor 440 based on a gain ($g_{m1}$) and the difference between the input voltage supplied to power converter 104 and the output voltage output by power converter 104 ($V_{in}-V_{out}$). Comparator 444 may include a first input coupled to capacitor 440, a second input coupled to reference voltage 446 corresponding to a voltage threshold, and an output configured to output an indication of the peak of the inductor current.

In the example of FIG. 4, system 100 (e.g., circuit 102 or, more specifically, for example, switching signal generator 128) may set the correct $t_{hs,on}$ using the output of comparator 444, which represents a signal proportional to ($V_{in}-V_{out}$). In this way, system 100 may estimate the peak inductor current ($i_{L,peak}$), which may help to reduce a power consumption of system 100 compared to systems that use a measured peak inductor current.

Figure 5:
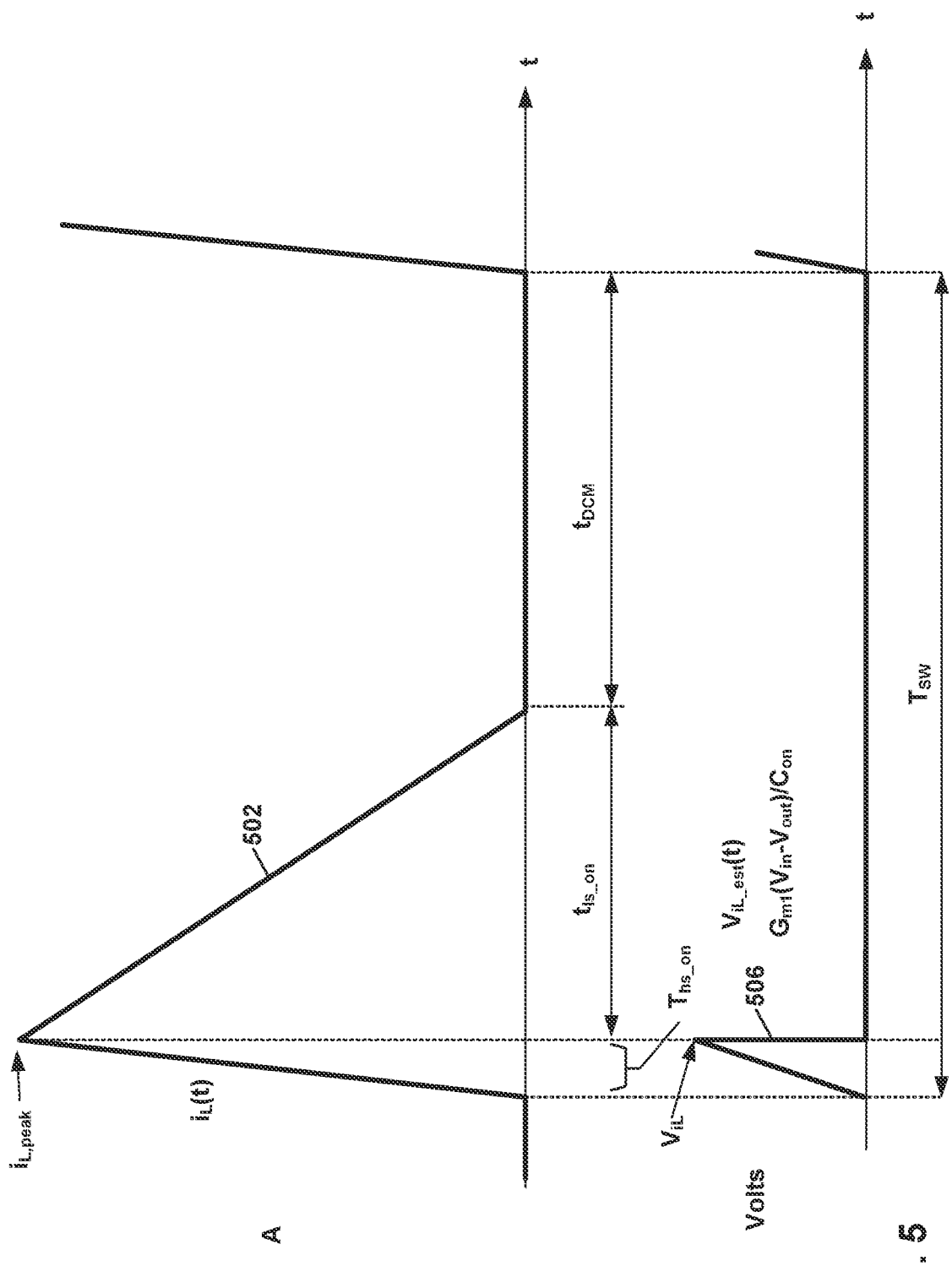
FIG. 5 is a graph illustrating an example of estimating a peak of the current at the inductive element when operating a power converter in DCM, in accordance with one or more techniques of this disclosure.

FIG. 5 is a graph illustrating an example of estimating a peak of the current at the inductive element 134 when operating power converter 104 in DCM, in accordance with one or more techniques of this disclosure. The horizontal axis (x-axis) represents time (t) and the vertical axis (y-axis) represents current 502 at an inductive element in amps and an estimated voltage ($V_{iL}$) 506 in volts. FIG. 5 is discussed with reference to FIGS. 1-4 for example purposes only.

System 100 may determine estimated voltage 506 using EQUATION 6.

$$V_{iL} = v_{iL\_est}(t_{hs,on}) = \frac{g_{m1} \cdot (V_{in} - V_{out}) \cdot t_{hs,on}}{C_{on}} \quad \text{EQUATION 6}$$

where $V_{iL}$ is the estimated voltage, $g_{m1}$ is the gain of current source 442, $V_{in}$ is the input voltage supplied to power converter 104, $V_{out}$ is the output voltage output by power converter 104, $t_{hs,on}$ is a is a turn on time of low-side switching element 231, and $C_{on}$ is a capacitance of capacitor 440.

Setting $$\frac{g_{m1}}{C_{on}} = \frac{1}{L}$$

(in absolute value), system 100 may determine that $V_{in}$ is equal to $i_{L,peak}$ (in value but not in units). That is, system 100 may use the $V_{iL}$ to estimate the peak inductor current ($i_{L,peak}$), which may help to reduce a power consumption of system 100 compared to systems that use a measured peak inductor current.

Figure 6:
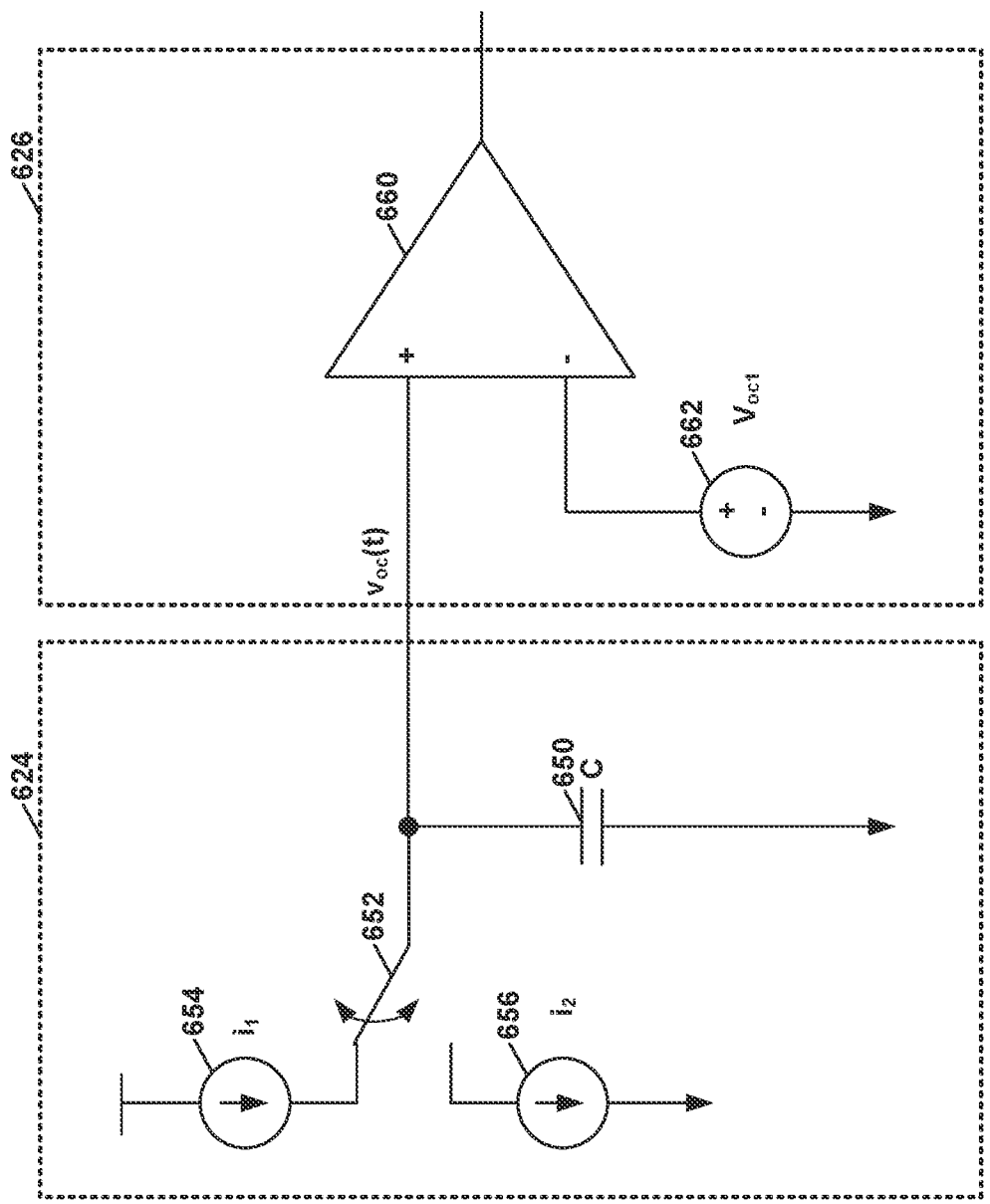
FIG. 6 is a circuit diagram illustrating an example of a comparison signal generator and an example of a threshold detector, in accordance with this disclosure.

FIG. 6 is a circuit diagram illustrating an example of a comparison signal generator 624 and an example of a threshold detector 626, in accordance with this disclosure. FIG. 6 is discussed with reference to FIGS. 1-5 for example purposes only.

Comparison signal generator 624 includes a capacitor 650. In this example, comparison signal generator 624 may, after the first time and before the second time determined by synchronization circuitry 122, drive a first current to charge the capacitor 650. For instance, logic circuitry may control switching element 652 (also referred to herein as "second switching element") to electrically couple current supply 654 (also referred to herein as a "first current supply") to a first node of capacitor 650 after the first time and before the second time determined by synchronization circuitry 122. Comparison signal generator 624 may, after the second time determined by synchronization circuitry 122, drive a second current to discharge the capacitor 650. For instance, the logic circuitry controls element 652 to electrically couple current supply 656 (also referred to herein as "second current supply") to the first node of capacitor 650 after the second time determined by synchronization circuitry 122. Current supply 654 and current supply 656 may output current of equal or may not be equal in magnitude. For example, current supply 654 may be configured to output the first current at a magnitude to charge capacitor 650 and current supply 656 may be configured to output the second current at the magnitude to discharge capacitor 650.

Threshold detector 626 may include a comparator 660 that includes a first input coupled to capacitor 650 and a second input coupled to a voltage 662 corresponding to the threshold value.

In the example of FIG. 6, comparison signal generator 624 generates comparison signal ($v_{oc}(t)$), which may be synchronized with both the switching signal ($v_{pwm}$) and a zero current crossing detector signal (see FIG. 7). The signals $v_{pwm}$ and $v_{zcd}$ may be already present in power converter 104 to, for example, implement the control system for setting a switching period of the switching signal.

In some examples, one or more functions of comparison signal generator 624 and/or threshold detector 626 may be performed using digital circuitry. For example, after the first time and before the second time determined by synchronization circuitry 122, digital circuitry of circuit 102 may add a first value to a current value of the comparison signal to generate a subsequent value of the comparison signal. In this example, the digital circuitry of circuit 102 may, after the second time, subtract a second value to the current value of the comparison signal to generate the subsequent value of the comparison signal. The digital circuitry may compare a value of the comparison signal at the end of a target switching period with a threshold value to generate a comparison result value and/or to determine whether to operate power converter 104 in DCM or CCM.

FIG. 7 is a graph illustrating an example of a comparison signal, in accordance with one or more techniques of this disclosure. The horizontal axis (x-axis) represents time (t) and the vertical axis (y-axis) represents current 702 at an inductive element in amps, a switching signal 710 ($v_{pwm}$) in volts, a zero current crossing signal ($v_{zcd}(t)$) 712 in volts, and a compensation signal ($V_{oc}(t)$) 714 in volts. FIG. 7 is discussed with reference to FIGS. 1-6 for example purposes only.

An example objective of system 100 may include a check if the actual switching period is greater, less than, or equal to a target switching period. If the actual period is longer than the target switching period, system 100 may determine that the average current will be less than the threshold current. Alternatively, if the actual switching period is longer than the target switching period, system 100 may determine that the average current is higher. The times $t_{hs,on}$ and $t_{ls,on}$ may be measured and may not change. The foregoing can be mathematically proved by EQUATIONS 7 and 8.

$$i_{L,avg,act} = \frac{i_{L,peak}}{2} \cdot \frac{t_{hs,on} + t_{ls,on}}{T_{SW,act}} \quad \text{EQUATION 7}$$

where $i_{L,avg,act}$ is the actual average current at inductive element 134, $I_{L,peak}$ is the peak current at inductive element 234, $t_{hs,on}$ is a turn on time of high-side switching element 232, $t_{ls,on}$ is a is a turn on time of low-side switching element 231, $T_{SW,act}$ is the actual switching period.

$$i_{L,avg,thr} = \frac{i_{L,peak}}{2} \cdot \frac{t_{hs,on} + t_{ls,on}}{T_{SW,thr}} \quad \text{EQUATION 8}$$

where $i_{L,avg,thr}$ is the target average current at inductive element 134, $i_{L,peak}$ is the peak current at inductive element 234, $t_{hs,on}$ is a turn on time of high-side switching element 232, $t_{ls,on}$ is a is a turn on time of low-side switching element 231, $T_{SW,thr}$ is the target switching period.

From EQUATIONS 7 and 8, when $T_{SW,act} > T_{SW,thr}$ then $i_{L,avg,act} < i_{L,avg,thr}$ and vice versa $T_{SW,act} < T_{SW,thr}$ then $i_{L,avg,act} > I_{L,avg,thr}$.

When $$I_{L,avg} = \frac{i_{L,peak}}{2K},$$

power converter 104 is on the "threshold condition" between CCM and DCM and, considering that, for every period, $v_{oc}$ starts from zero):

$$\frac{i_1}{C} \cdot \frac{T_{SW}}{K} = \frac{i_2}{C} \cdot \frac{K-1}{K} T_{SW} + V_{oc1}. \quad \text{EQUATION 9}$$

For simplicity $V_{oc1}=0$ (as shown in FIG. 7), $i_1/i_2=K-1$. System 100 may latch comparison signal 714 every period to have the information if the value of the comparison signal at the end of a target switching period is above or below the threshold.

Circuits that are active during "estimation" phase (e.g., during $t_{DCM}$) may include peak current estimation circuitry (e.g., in switching signal generator 128) and/or a period comparison circuit (e.g., comparison signal generator 124). All other circuits (e.g. zero detection circuitry (Zcd) and/or synchronization circuitry 122 (PWM)) may be active for normal device operation. The peak estimation circuit can be simple and fast, so can be switched on and off depending on the conditions and could consist of or include few current mirrors and a comparator (See FIG. 4). The period comparison circuit may consist of or include two current sources and one comparator, so the current consumption could be set in tens of μA range during operation which could be further reduced when the target period threshold is elapsed.

Figure 8A:
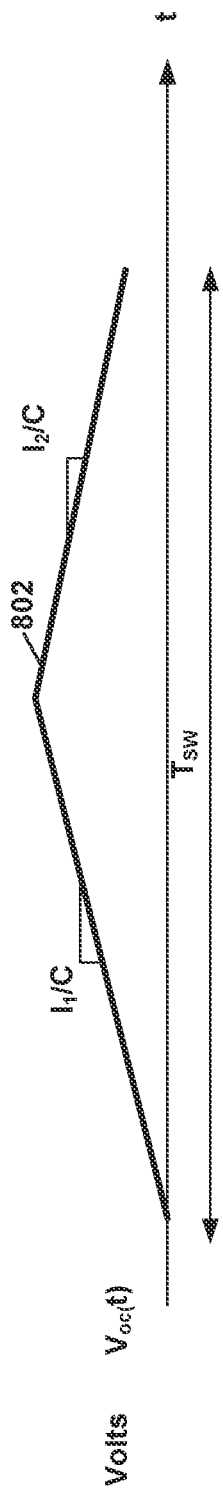
FIGS. 8A, 8B, and 8C are graphs illustrating example comparison signals, in accordance with one or more techniques of this disclosure.
Figure 8B:
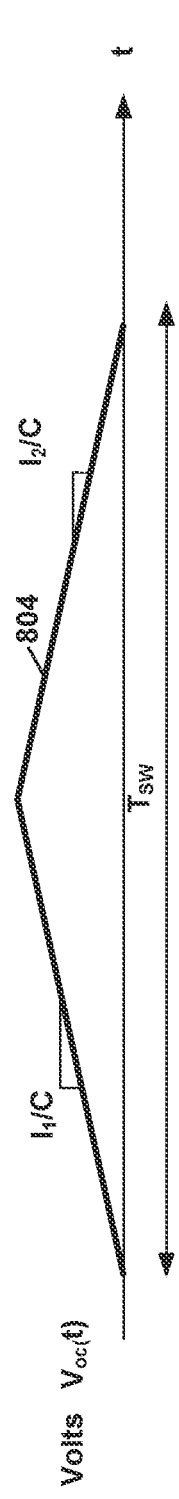
Figure 8C:
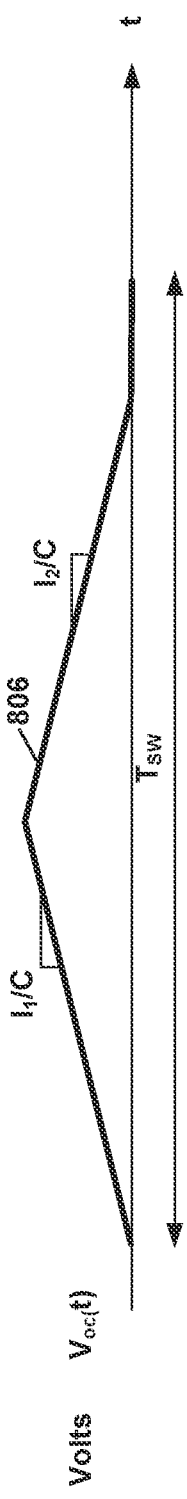

FIGS. 8A, 8B, and 8C are graphs illustrating example comparison signals 802, 804, 806, in accordance with one or more techniques of this disclosure. The horizontal axis (x-axis) of FIGS. 8A, 8B, and 8C represents time (t) and the vertical axis (y-axis) represents a first comparison signal 802 in volts, a second comparison signal 804 in volts, and a third comparison signal 806 in volts. FIGS. 8A-8C is discussed with reference to FIGS. 1-7 for example purposes only. Threshold detector 126 may determine whether to operate power converter 104 in DCM or CCM based on the comparison of the value at the end of the target switching period with a threshold value (e.g., 0). In the example of FIG. 8A, threshold detector 126 may determine not to operate power converter 104 in the DCM when the value of comparison signal 802 at the end of the target switching period ($T_{SW}$) is greater than the threshold value (e.g., 0). In the example of FIG. 8B, threshold detector 126 may determine to continue to operate power converter 104 in DCM when the value of comparison signal 804 at the end of the target switching period ($T_{SW}$) equals the threshold value (e.g., 0). In the example of FIG. 8C, threshold detector 126 may determine to continue to operate power converter 104 in the DCM when the value of comparison signal 806 at the end of the target switching period is not greater than the threshold value. For instance, threshold detector 126 may determine to continue to operate power converter 104 in the DCM when the value of comparison signal 806 reaches zero before the end of the target switching period ($T_{SW}$).

In some examples, threshold detector 126 may generate a comparison result based on the comparison of the value at the end of a target switching period with the threshold value For instance, threshold detector 126 may generate the comparison result value with a first value (e.g., a 0 or 1) when the value of comparison signal 802 at the end of the target switching period ($T_{SW}$) is greater than the threshold value (e.g., 0). In this example, threshold detector 126 may generate the comparison result value with a second value, different from the first value (e.g., a 1 or 0), when the value of comparison signal 806 at the end of the target switching period is not greater than the threshold value. For instance, threshold detector 126 may generate the comparison result value with the second value when the value of comparison signal 806 reaches zero before the end of the target switching period ($T_{SW}$). Threshold detector 126 may output the comparison result, which may determine whether to operate power converter 104 in DCM or CCM based on the comparison result value.

Figure 9:
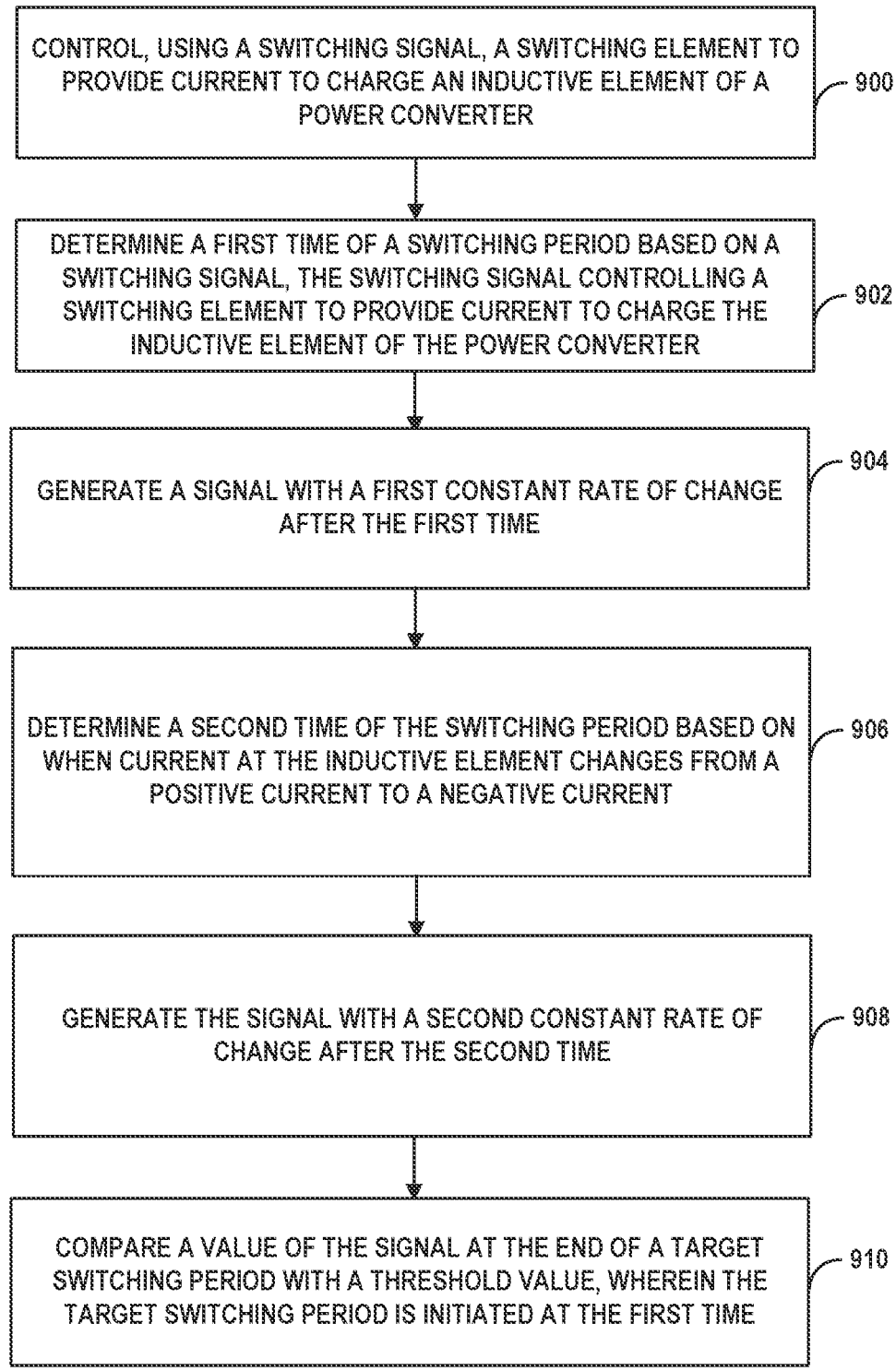
FIG. 9 is a flow diagram consistent with techniques that may be performed by the example system of FIG. 1, in accordance with this disclosure.

FIG. 9 is a flow diagram consistent with techniques that may be performed by the example system of FIG. 1, in accordance with this disclosure. FIG. 9 is discussed with reference to FIGS. 1-7 and 8A-8C for example purposes only.

Switching signal generator 128 may control, using a switching signal, switching element 132 to provide current to charge inductive element 134 of power converter 104 (900). Synchronization circuitry 122 may determine a first time of a switching period based on the switching signal (902). For example, synchronization circuitry 122 may determine the first time to correspond to a start of a turn-on state of a high-side turn on time ($T_{hs\_on}$ of FIG. 7).

Comparison signal generator 124 may generate a signal with a first constant rate of change after the first time (904). For example, comparison signal generator 624 may control switching element 652 to electrically connect current supply 654 to capacitor 650 after the first time. In some examples, digital circuitry of comparison signal generator 124 may add a first value to a current value of the comparison signal to generate a subsequent value of the comparison signal.

Synchronization circuitry 122 may determine a second time of the switching period based on when current at the inductive element changes from a positive current to a negative current (906). For example, synchronization circuitry 122 may determine the second time to correspond to a signal indicating a detection of a zero crossing by a zero crossing detector ($V_{zcd}(t)$ of FIG. 7). In some examples, digital circuitry of comparison signal generator 124 may, after the second time, subtract a second value to the current value of the comparison signal to generate the subsequent value of the comparison signal.

Comparison signal generator 124 may generate the comparison signal with a second constant rate of change after the second time (908). For example, comparison signal generator 624 may control switching element 652 to electrically connect current supply 656 to capacitor 650 after the second time. In some examples, digital circuitry of comparison signal generator 124 may subtract a second value (e.g., equal to the first value) to a current value of the comparison signal to generate a subsequent value of the comparison signal.

Threshold detector 126 may compare a value of the comparison signal at the end of a target switching period with a threshold value (910). The target switching period may be initiated at the first time. For example, threshold detector 126 may determine to stop operating power converter 104 in the DCM when the value of comparison signal 802 at the end of the target switching period ($T_{SW}$) is greater than the threshold value (e.g., 0). Threshold detector 126 may determine to continue to operate power converter 104 in the DCM when the value of comparison signal 806 at the end of the target switching period is not greater than the threshold value. In some examples, threshold detector 126 may generate a comparison result based on the comparison of the value at the end of a target switching period with the threshold value. In this example, another circuit may determine whether to operate power converter 104 in DCM or CCM.

The following examples may illustrate one or more aspects of the disclosure.

Clause 1. A circuit comprising: a switching signal generator configured to control, using a switching signal, a switching element to provide current to charge an inductive element of a power converter; synchronization circuitry configured to determine a first time of a switching period based on the switching signal; a comparison signal generator configured to generate a comparison signal with a first constant rate of change after the first time; wherein the synchronization circuitry is further configured to determine a second time of the switching period based on when current at the inductive element changes from a positive current to a negative current; wherein the comparison signal generator is further configured to generate the comparison signal with a second constant rate of change after the second time; and a threshold detector configured to compare a value of the comparison signal at the end of a target switching period with a threshold value, wherein the target switching period is initiated at the first time.

Clause 2. The circuit of clause 1, wherein the threshold detector is further configured to determine whether to operate the power converter in a DCM or a CCM based on the comparison of the value at the end of the target switching period with the threshold value.

Clause 3. The circuit of any clause 1, wherein to determine whether to operate the power converter in the DCM or the CCM, the threshold detector is configured to: determine to continue to operate the power converter in the DCM when the value of the comparison signal at the end of the target switching period is not greater than the threshold value; and determine to not operate the power converter in the DCM when the value of the comparison signal at the end of the target switching period is greater than the threshold value.

Clause 4. The circuit of any of clauses 2-3, wherein the switching signal generator is further configured to control, when the power converter is operating in the CCM, a duty cycle for a fixed switching cycle based on an average of the current at the inductive element during the fixed switching period.

Clause 5. The circuit of any of clauses 2-4, wherein the switching signal generator is further configured to control, when the power converter is operating in the DCM, a duration of a switching period.

Clause 6. The circuit of clause 1, wherein the threshold detector is further configured to: generate a comparison result based on the comparison of the value at the end of a target switching period with the threshold value; and output the comparison result.

Clause 7. The circuit of any of clauses 1-6, wherein the comparison signal generator comprises digital circuitry; wherein to generate the comparison signal with the first constant rate, the digital circuitry is configured to, after the first time and before the second time, add a first value to a current value of the comparison signal to generate a subsequent value of the comparison signal; and wherein to generate the comparison signal with the second constant rate, the digital circuitry is configured to, after the second time, subtract a second value to the current value of the comparison signal to generate the subsequent value of the comparison signal.

Clause 8. The circuit of any of clauses 1-6, wherein the comparison signal generator comprises: a capacitor; wherein to generate the comparison signal with the first constant rate, the comparison signal generator is configured to, after the first time and before the second time, drive a first current to charge the capacitor; and wherein to generate the comparison signal with the second constant rate, the comparison signal generator is configured to, after the second time, drive a second current to discharge the capacitor after the second time.

Clause 9. The circuit of clause 8, wherein the comparison signal generator further comprises: a second switching element; a first current supply, wherein to drive the first current, the circuit is configured to drive the second switching element to electrically couple a first node of the capacitor to the first current source; and a second current supply, wherein to drive the second current, the circuit is configured to drive the second switching element to electrically couple the first node of the capacitor to the second current source.

Clause 10. The circuit of clause 9, wherein the first current supply is configured to output the first current at a magnitude to charge the capacitor; and wherein the second current supply is configured to output the second current at the magnitude to discharge the capacitor.

Clause 11. The circuit of any of clauses 8-10, wherein the threshold detector comprises a comparator that includes a first input coupled to the capacitor and a second input coupled to a voltage corresponding to the threshold value.

Clause 12. The circuit of any of clauses 1-11, wherein the switching signal generator is further configured to estimate a peak of the current at the inductive element during the switching period based on a difference between an input voltage supplied to the power converter and an output voltage output by the power converter.

Clause 13. The circuit of clause 12, wherein the switching signal generator comprises: a capacitor; a current source configured to output a charging current to the capacitor based on a gain and the difference between the input voltage supplied to the power converter and the output voltage output by the power converter; a comparator comprising a first input coupled to the second capacitor, a second input coupled to a voltage corresponding to a voltage threshold, and an output configured to output an indication of the peak of the inductor current.

Clause 14. The circuit of any of clauses 1-13, wherein the switching signal generator comprises a current sensor configured to generate a measured current signal based on the current at the inductive element, wherein the circuit is configured to determine an average of the current at the inductive element during the switching period based on the measured current signal.

Clause 15. The circuit of any of clauses 1-14, wherein the power converter comprises a Buck converter.

Clause 16. The circuit of any of clauses 1-15, wherein the synchronization circuitry comprises a zero current crossing detector configured to output a zero current crossing signal, wherein the synchronization circuitry is configured to determine the second time using the zero crossing signal.

Clause 17. A method comprising: controlling, using a switching signal, a switching element to provide current to charge an inductive element of a power converter; determining a first time of a switching period based on the switching signal; generating a signal with a first constant rate of change after the first time; determining a second time of the switching period based on when current at the inductive element changes from a positive current to a negative current; generating the comparison signal with a second constant rate of change after the second time; and comparing a value of the comparison signal at the end of a target switching period with a threshold value, wherein the target switching period is initiated at the first time.

Clause 18. The method of clause 17, further comprising determining whether to operate the power converter in a DCM or a CCM based on the comparison of the value at the end of the target switching period with the threshold value.

Clause 19. The method of clause 18, wherein determining whether to operate the power converter in the DCM or the CCM comprises: determining to continue to operate the power converter in the DCM when the value of the comparison signal at the end of the target switching period is not greater than the threshold value; and determining to not operate the power converter in the DCM when the value of the comparison signal at the end of the target switching period is greater than the threshold value.

Clause 20. A system comprising: a power converter comprising an inductive element; and a control circuit comprising: a switching signal generator configured to control, using a switching signal, a switching element to provide current to charge the inductive element of the power converter; synchronization circuitry configured to determine a first time of a switching period based on the switching signal; a comparison signal generator configured to generate a signal with a first constant rate of change after the first time; wherein the synchronization circuitry is further configured to determine a second time of the switching period based on when current at the inductive element changes from a positive current to a negative current; wherein the comparison signal generator is further configured to generate the signal with a second constant rate of change after the second time; and a threshold detector configured to compare a value of the signal at the end of a target switching period with a threshold value, wherein the target switching period is initiated at the first time.

In one or more examples, the functions being performed described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this way, computer-readable media generally may correspond to tangible computer-readable storage media, which is non-transitory. Data storage media may be any available media that can be accessed by one or more computers or one or more processors to retrieve instructions, code and/or data structures for implementation of the techniques described in this disclosure. A computer program product may include a computer-readable medium.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various aspects have been described in this disclosure. These and other aspects are within the scope of the following claims.

What is claimed is:

1. A circuit comprising:
a switching signal generator configured to control, using a switching signal, a switching element to provide current to charge an inductive element of a power converter;
synchronization circuitry configured to determine a first time of a switching period based on the switching signal;
a comparison signal generator configured to generate a comparison signal with a first constant rate of change after the first time;
wherein the synchronization circuitry is further configured to determine a second time of the switching period based on when current at the inductive element changes from a positive current to a negative current;
wherein the comparison signal generator is further configured to generate the comparison signal with a second constant rate of change after the second time; and
a threshold detector configured to compare a value of the comparison signal at the end of a target switching period with a threshold value, wherein the target switching period is initiated at the first time.

2. The circuit of claim 1, wherein the threshold detector is further configured to determine whether to operate the power converter in a discontinuous conduction mode (DCM) or a continuous conduction mode (CCM) based on the comparison of the value at the end of the target switching period with the threshold value.

3. The circuit of claim 2, wherein to determine whether to operate the power converter in the DCM or the CCM, the threshold detector is configured to:
determine to continue to operate the power converter in the DCM when the value of the comparison signal at the end of the target switching period is not greater than the threshold value; and
determine to not operate the power converter in the DCM when the value of the comparison signal at the end of the target switching period is greater than the threshold value.

4. The circuit of claim 2, wherein the switching signal generator is further configured to control, when the power converter is operating in the CCM, a duty cycle for a fixed switching cycle based on an average of the current at the inductive element during the fixed switching period.

5. The circuit of claim 2, wherein the switching signal generator is further configured to control, when the power converter is operating in the DCM, a duration of a switching period.

6. The circuit of claim 1, wherein the threshold detector is further configured to:
generate a comparison result based on the comparison of the value at the end of a target switching period with the threshold value; and
output the comparison result.

7. The circuit of claim 1,
wherein the comparison signal generator comprises digital circuitry;
wherein to generate the comparison signal with the first constant rate, the digital circuitry is configured to, after the first time and before the second time, add a first value to a current value of the comparison signal to generate a subsequent value of the comparison signal; and
wherein to generate the comparison signal with the second constant rate, the digital circuitry is configured to, after the second time, subtract a second value to the current value of the comparison signal to generate the subsequent value of the comparison signal.

8. The circuit of claim 1, wherein the comparison signal generator comprises:
a capacitor;
wherein to generate the comparison signal with the first constant rate, the comparison signal generator is configured to, after the first time and before the second time, drive a first current to charge the capacitor; and
wherein to generate the comparison signal with the second constant rate, the comparison signal generator is configured to, after the second time, drive a second current to discharge the capacitor after the second time.

9. The circuit of claim 8, wherein the comparison signal generator further comprises:
a second switching element;
a first current supply, wherein to drive the first current, the circuit is configured to drive the second switching element to electrically couple a first node of the capacitor to the first current source; and
a second current supply, wherein to drive the second current, the circuit is configured to drive the second switching element to electrically couple the first node of the capacitor to the second current source.

10. The circuit of claim 9,
wherein the first current supply is configured to output the first current at a magnitude to charge the capacitor; and
wherein the second current supply is configured to output the second current at the magnitude to discharge the capacitor.

11. The circuit of claim 8, wherein the threshold detector comprises a comparator that includes a first input coupled to the capacitor and a second input coupled to a voltage corresponding to the threshold value.

12. The circuit of claim 1, wherein the switching signal generator is further configured to estimate a peak of the current at the inductive element during the switching period based on a difference between an input voltage supplied to the power converter and an output voltage output by the power converter.

13. The circuit of claim 12, wherein the switching signal generator comprises:
a capacitor;
a current source configured to output a charging current to the capacitor based on a gain and the difference between the input voltage supplied to the power converter and the output voltage output by the power converter;
a comparator comprising a first input coupled to the second capacitor, a second input coupled to a voltage corresponding to a voltage threshold, and an output configured to output an indication of the peak of the inductor current.

14. The circuit of claim 1, wherein the switching signal generator comprises a current sensor configured to generate a measured current signal based on the current at the inductive element, wherein the circuit is configured to determine an average of the current at the inductive element during the switching period based on the measured current signal.

15. The circuit of claim 1, wherein the power converter comprises a Buck converter.

16. The circuit of claim 1, wherein the synchronization circuitry comprises a zero current crossing detector configured to output a zero current crossing signal, wherein the synchronization circuitry is configured to determine the second time using the zero crossing signal.

17. A method comprising:
controlling, using a switching signal, a switching element to provide current to charge an inductive element of a power converter;
determining a first time of a switching period based on the switching signal;
generating a signal with a first constant rate of change after the first time;
determining a second time of the switching period based on when current at the inductive element changes from a positive current to a negative current;
generating the comparison signal with a second constant rate of change after the second time; and
comparing a value of the comparison signal at the end of a target switching period with a threshold value, wherein the target switching period is initiated at the first time.

18. The method of claim 17, further comprising determining whether to operate the power converter in a discontinuous conduction mode (DCM) or a continuous conduction mode (CCM) based on the comparison of the value at the end of the target switching period with the threshold value.

19. The method of claim 18, wherein determining whether to operate the power converter in the DCM or the CCM comprises:
determining to continue to operate the power converter in the DCM when the value of the comparison signal at the end of the target switching period is not greater than the threshold value; and
determining to not operate the power converter in the DCM when the value of the comparison signal at the end of the target switching period is greater than the threshold value.

20. A system comprising:
a power converter comprising an inductive element; and
a control circuit comprising:
a switching signal generator configured to control, using a switching signal, a switching element to provide current to charge the inductive element of the power converter;
synchronization circuitry configured to determine a first time of a switching period based on the switching signal;
a comparison signal generator configured to generate a signal with a first constant rate of change after the first time;
wherein the synchronization circuitry is further configured to determine a second time of the switching period based on when current at the inductive element changes from a positive current to a negative current;
wherein the comparison signal generator is further configured to generate the signal with a second constant rate of change after the second time; and
a threshold detector configured to compare a value of the signal at the end of a target switching period with a threshold value, wherein the target switching period is initiated at the first time.

* * * * *